(12) United States Patent
Kingdon et al.

(10) Patent No.: US 6,256,505 B1
(45) Date of Patent: Jul. 3, 2001

(54) GSM TRANSCEIVER UNIT EQUIPPED FOR TIME OF ARRIVAL MEASUREMENTS

(75) Inventors: Christopher Hugh Kingdon, Garland; Bagher Rouhollah Zadeh, Dallas, both of TX (US); Anders Thomas Holmring, Stockholm; Lars-Goran Lund, Hasselby, both of (SE)

(73) Assignee: Ericsson Inc., Richardson, TX (US)

( * ) Notice: Subject to any disclaimer, the term of this patent is extended or adjusted under 35 U.S.C. 154(b) by 0 days.

(21) Appl. No.: 09/086,759

(22) Filed: May 28, 1998

(51) Int. Cl.[7] ................................................ H04Q 7/30
(52) U.S. Cl. ....................... 455/456; 455/561; 342/457
(58) Field of Search ................................ 455/456, 457, 455/524, 525, 561; 342/450, 457

(56) References Cited

U.S. PATENT DOCUMENTS

| | | | |
|---|---|---|---|
| 5,423,067 | * | 6/1995 | Manabe ................................ 455/456 |
| 5,629,710 | * | 5/1997 | Sawada ................................ 455/456 |
| 5,732,354 | * | 3/1998 | MacDonald .......................... 455/456 |
| 5,854,985 | * | 12/1998 | Sainton et al. ....................... 455/553 |
| 6,021,330 | * | 2/2000 | Vannucci .............................. 455/456 |

FOREIGN PATENT DOCUMENTS

| | | |
|---|---|---|
| 0 800 319 | 10/1997 | (EP) . |
| WO 98/15150 | 4/1998 | (WO) . |

* cited by examiner

*Primary Examiner*—Edward F. Urban
(74) *Attorney, Agent, or Firm*—Arthur I. Navarro

(57) ABSTRACT

In a base station for use in a mobile communication system for communication with mobile subscribers over a plurality of radio channels, an improved transceiver unit is provided including a traffic controller handling downlink and uplink communication traffic with mobile subscribers over the plurality of radio channels, and a measuring device measuring arrival times of burst signals from a mobile subscriber communicating on a select one of the radio channels, or from a mobile subscriber communicating on another transceiver unit, on one of the plurality of radio channels.

5 Claims, 5 Drawing Sheets

GSM TRANSCEIVER UNIT EQUIPPED FOR TIME OF ARRIVAL MEASUREMENTS

FIELD OF THE INVENTION

The present invention is directed toward an improved transceiver unit for use in a mobile communication system and, more particularly, toward an improved transceiver unit equipped for time of arrival measurements.

BACKGROUND OF THE INVENTION

Mobile communication systems generally include a plurality of base stations, with each base station covering or servicing a particular geographical area or cell. Each base station is equipped with one to twelve transceiver units, or traffic controllers, which handle uplink and downlink communication traffic with a plurality of mobile subscribers over a plurality of radio channels. For location determination purposes, i.e., approximating the location of a particular mobile subscriber, the base station may also be equipped with a time of arrival measurement unit for measuring the arrival times of burst signals transmitted from the mobile subscriber whose location is to be approximated. The time of arrival measurements may be made on burst signals transmitted from a mobile subscriber within the particular cell serviced by the base station, or also may be made on burst signals transmitted from a mobile subscriber in another cell.

The time of arrival measurements are transmitted from the base stations to a mobile positioning center within the mobile communication system. The mobile positioning center analyzes the time of arrival measurements from various base stations, whose coordinates are known, and determines an approximate range within which the mobile subscriber is located.

Incorporating stand-alone Transceiver Units (TRUs) and Time of Arrival Measurement Receivers (TMRs) into a base station adds to the physical size of the base station. Further, since the base station can simultaneously receive traffic and measurement bursts in parallel on the same channel, additional hardware and signal processing is required to distinguish between the two signals.

The present invention is directed toward overcoming one or more of the above-mentioned problems.

SUMMARY OF THE INVENTION

In a base station for use in a mobile communication system for communication with mobile subscribers over a plurality of radio channels, an improved transceiver is provided including a traffic controller handling downlink and uplink communication traffic with mobile subscribers over the plurality of radio channels, and a measuring device measuring arrival times of burst signals from a mobile subscriber communicating on a select one of the radio channels, or from a mobile subscriber communicating on another transceiver unit, on one of the plurality of radio channels.

In one aspect of the improved transceiver, uplink communication traffic on said one of the plurality of radio channels at the traffic controller is interrupted during burst signal measurement by the measuring device.

In another aspect of the improved transceiver, uplink communication traffic on said one of the plurality of radio channels at the traffic controller is interrupted for approximately 0.4–0.5 seconds for burst signal time of arrival measurement.

In another aspect of the improved transceiver, downlink and uplink communication traffic on said one of the plurality of radio channels is cleared at the traffic controller to allow the measuring device to measure burst signal time of arrival on said one of the plurality of radio channels.

In still another aspect of the improved transceiver, downlink and uplink communication traffic on said one of the plurality of radio channels is switched to another of the plurality of radio channels available for communication traffic at the traffic controller to allow the measuring device to measure burst signal time of arrival on said one of the plurality of radio channels.

A method of determining the location of a mobile subscriber communicating with a serving base station on a select radio channel is provided, the location determining method including the steps of selecting at least three base stations to measure arrival times of burst signals from the mobile subscriber, tuning the at least three base stations to listen to the select radio channel, transmitting a burst signal from the mobile subscriber on the select radio channel, measuring a time of arrival of the burst signal at each of the at least three base stations, and analyzing the time of arrival measurements from the at least three base stations to determine the location of the mobile subscriber.

In one aspect of the location determining method, the at least three base stations include the serving base station and at least two secondary base stations.

In another aspect of the location determining method, the step of tuning the at least three base stations to listen to the select radio channel further includes the step of clearing the select radio channel of communication traffic at each of the at least two secondary base stations.

In another aspect of the location determining method, the step of clearing the select radio channel of communication traffic at each of the at least two secondary base stations includes the step of switching communication traffic on the select radio channel at the at least two secondary base stations to a radio channel different than the select radio channel, with the different radio channel being available for communication traffic.

In another aspect of the location determining method, the step of measuring a time of arrival of the burst signal at each of the at least three base stations includes the steps of interrupting uplink communication traffic on the select radio channel at the at least two secondary base stations, and measuring a time of arrival of the burst signal at each of the at least two secondary base stations during the interruption.

In still another aspect of the location determining method, uplink communication traffic on the select radio channel at the at least two secondary base stations is interrupted for approximately 0.4–0.5 seconds for burst signal time of arrival measurement.

It is an object of the present invention to provide an improved transceiver unit having dual functionality.

It is a further object of the present invention to provide an improved transceiver unit capable of serving the dual purpose of a regular GSM traffic receiver and a time of arrival measurement receiver.

It is a further object of the present invention to provide an improved transceiver unit with reduced hardware costs.

It is yet a further object of the present invention to provide an improved transceiver unit with reduced operation and management processes.

Other aspects, objects and advantages of the present invention can be obtained from a study of the application, the drawings, and the appended claims.

DETAILED DESCRIPTION OF THE PREFERRED EMBODIMENTS

Figure 1:
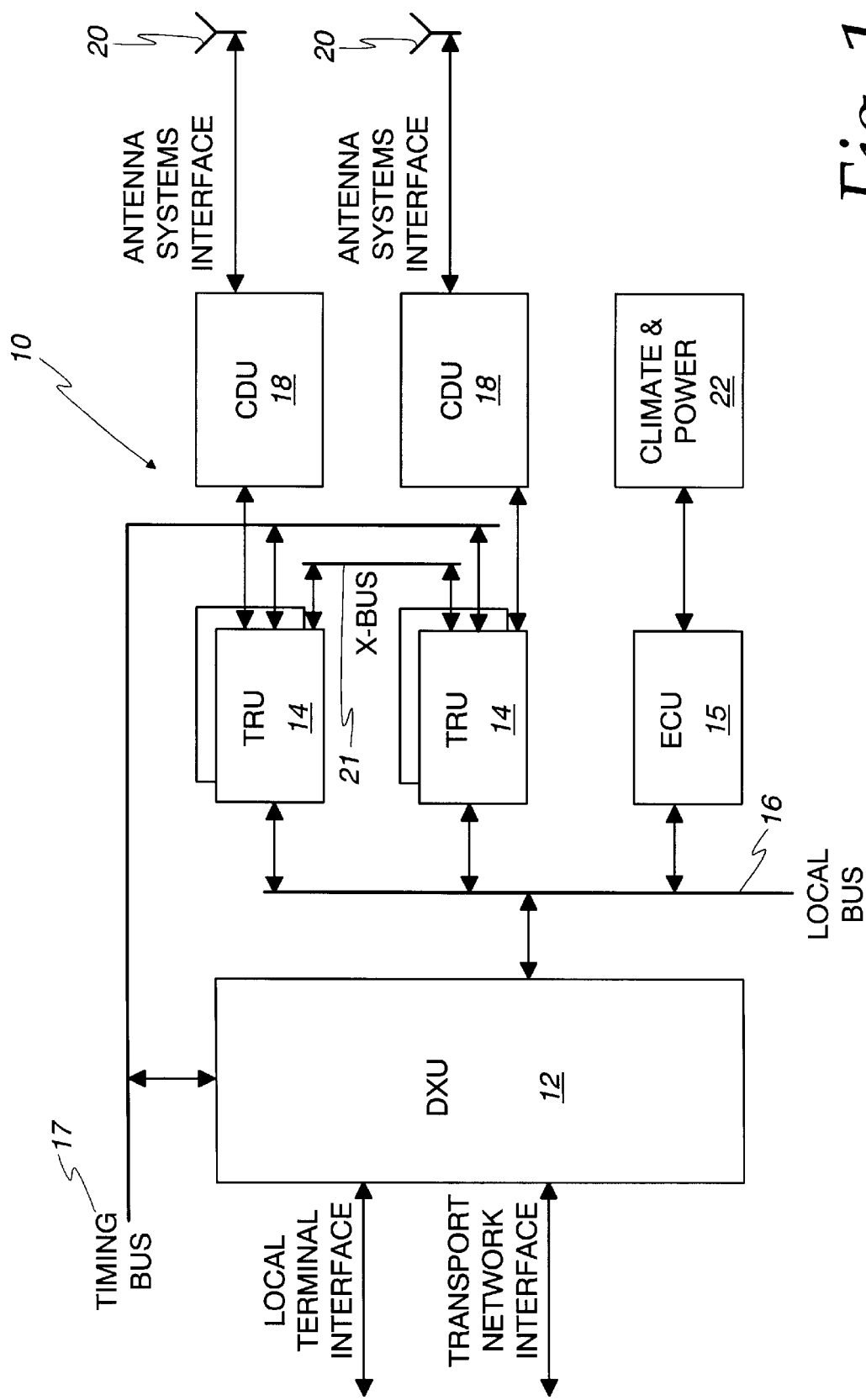
FIG. 1 is a block diagram of the relevant elements of a base station utilized in a mobile communication system.

FIG. 1 generally depicts the relevant elements of a base station, shown generally at 10, for use in a mobile communication system such as a conventional GSM (Global System for Mobile Communications) system. The base station 10 includes a Distribution Switch Unit (DXU) 12 which communicates internally with a plurality of transceiver units (TRUs) 14 and an environmental control unit (ECU) 15 via a local bus 16. The DXU 12 communicates with both local terminal and transport network interfaces, as is known, and keeps track of time in the base station 10 via a timing bus 17. A plurality of Combiner Distribution Unit (CDUs) 18 are provided which essentially act as an interface between the TRUs 14 and plural antennas 20. Received signals are transmitted directly from the CDU 18 to the TRU 14, while signals to be transmitted are communicated from the TRU 14 to the CDU 18 via a transfer bus, or X-bus 21. The base station 10 also includes a Climate & Power unit 22, which in conjunction with the ECU 15 controls operation of fans, air conditioning, etc. within the base station 10.

Normally, one to twelve TRUs 14 are provided within the base station 10. One TRU 14 is generally dedicated to one whole frequency or radio channel, and is thus capable of handling simultaneously all eight time slots of a time division multiplexed (TDM) signal transmitted on that particular frequency.

Figure 2:
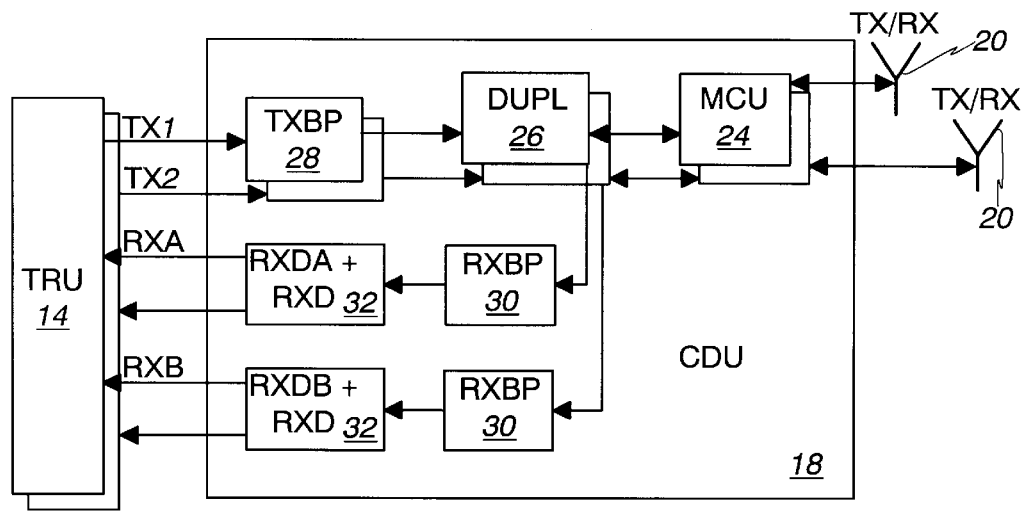
FIG. 2 is a block diagram of the CDU block depicted in FIG. 1.

As shown in FIG. 2, the CDU 18 includes measurement control units (MCUs) 24 which measure the signal strengths of the radio antennas 20 checking for problems. For instance, if the antenna 20 is broken, the signal that was sent out may come bouncing back to the receiver at a high power causing damage. The MCU 24 protects against this. A duplexer (DUPLs) 26 is provided which allows the CDU 18 to transmit and receive signals on the same antenna 20. Conventional transmit (TXBP) 28 and receive (RXBP) 30 bandpass filters are also provided to filter out unwanted signals.

Signals to be transmitted are passed from the TRU 14 through the transmit bandpass filter 28 to the duplexer 26. The duplexer 26 performs a conventional duplex function on the signal and passes it through the MCU 24 to the antenna 20 where it is transmitted. Signals received by the antenna 20 pass through the MCU 24 to the duplexer 26, which performs a conventional reverse duplex function on the received signal. The received signal passes through the receive bandpass filters 30 to conventional signal processing splitters (RXDA+RDA and RXDB+RDB) 32, which essentially copy the received signal to two output signals which can be sent to different TRUs 14. It should be noted that if the duplexer 26 is not included within the CDU 18, then different receive and transmit antennas would need to be utilized, with the receive bandpass filters 30 connected directly to the receive antenna. Essentially, any conventional CDU 18 may be incorporated with the present invention.

Figure 3:
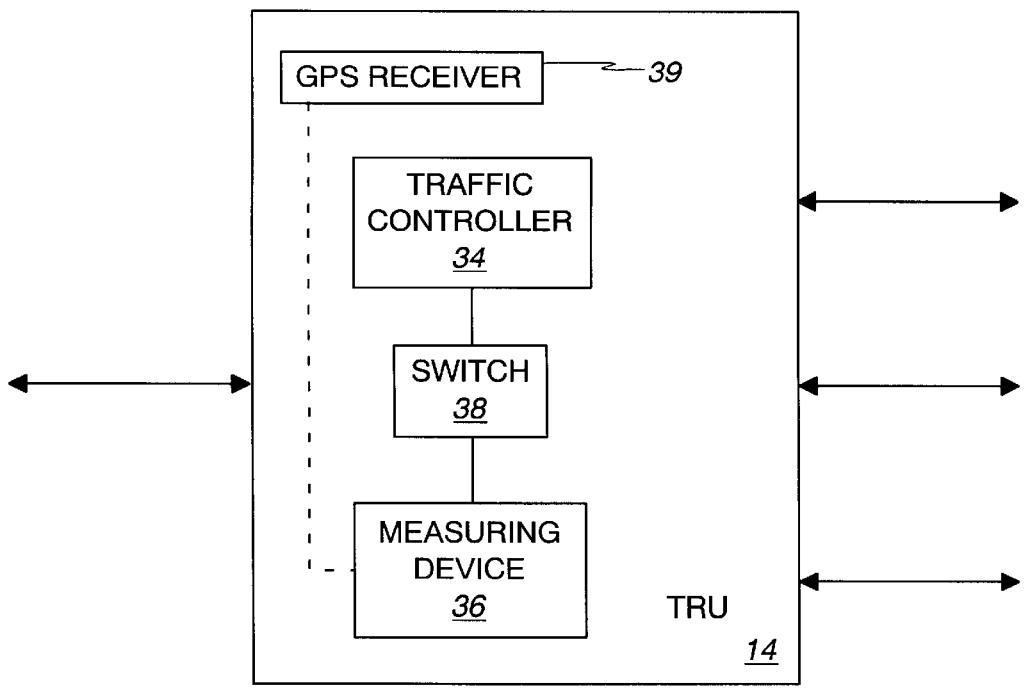
FIG. 3 is a block diagram of the improved transceiver unit according to the present invention.

FIG. 3 illustrates a block diagram of the TRU 14 according to the present invention. The TRU 14 includes a traffic controller 34 and a measuring device 36, the two elements being interconnected by a switch 38. The traffic controller 34 is capable of handling downlink and uplink communication traffic over a plurality of radio channels with a plurality of mobile subscribers within the mobile communication system. The measuring device 36 is essentially a receiver which can be reconfigured per time slot to measure arrival times of burst signals from a mobile subscriber on a different physical channel (one belonging to a neighboring cell). The switch 38 controls both the traffic controller 34 and measuring device 36 so that only one of the two devices, 34 or 36, may be operated at one time in a particular time slot on a particular frequency or radio channel.

The TRU 14 interfaces or contains a GPS (Global Positioning System) receiver 39 which is used for time synchronization of the measuring device 36 via the timing bus (see FIG. 1). Operation of the improved TRU 14 for location determination will now be described.

Figure 4:
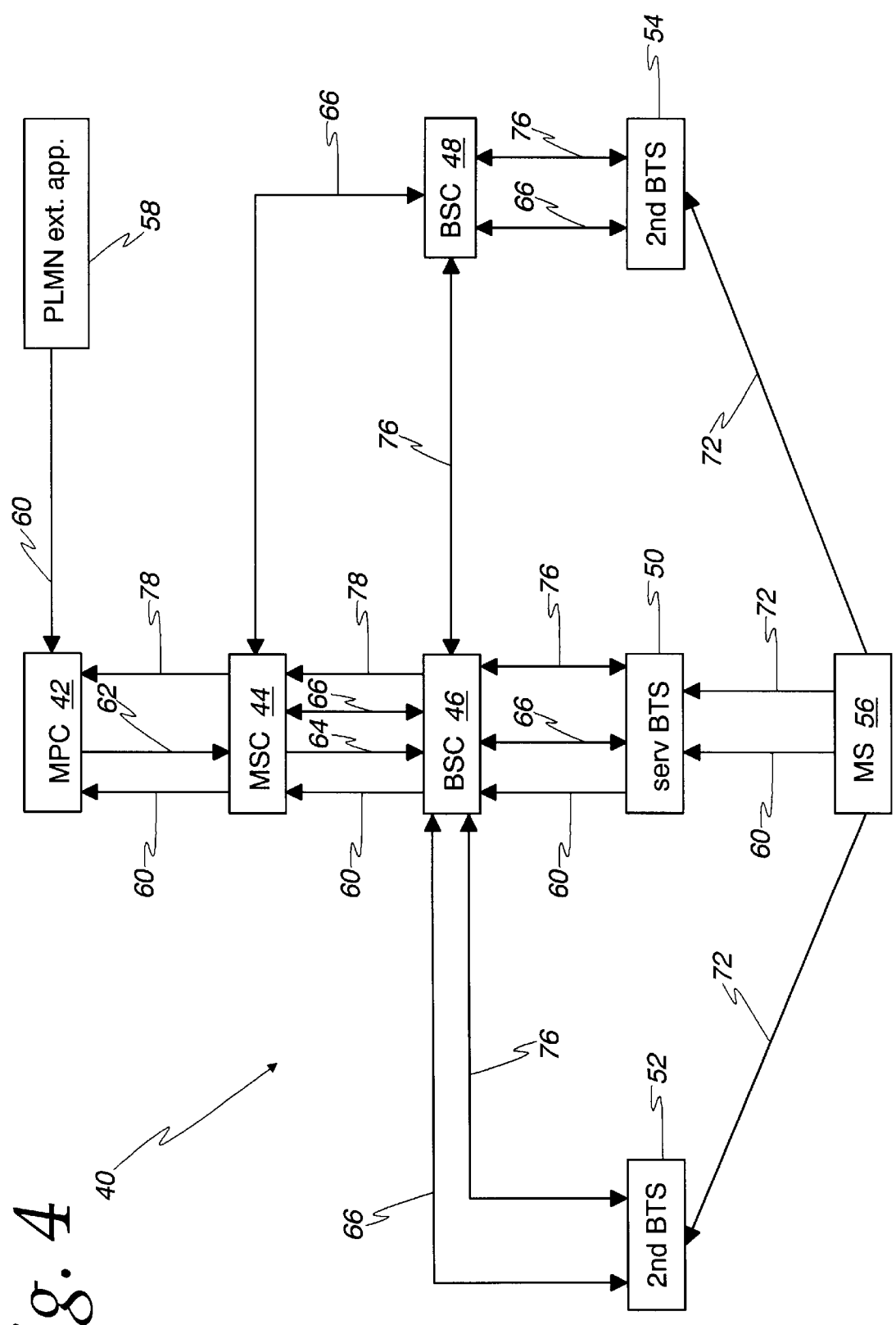
FIG. 4 is a block diagram of the relevant elements in a mobile communication system.

FIG. 4 depicts a block diagram of a mobile communication system, shown generally at 40. The system 40 includes a mobile positioning center (MPC) 42, a mobile switching center (MSC) 44, base station controllers (BSCs) 46, 48 and a plurality of base stations 50, 52, 54. For convenience, the base stations are divided into a serving base station 50 which services a particular mobile subscriber (MS) 56 whose location is to be determined, and secondary base stations 52, 54 servicing adjacent or neighboring cells. As shown in FIG. 4, the BSC 46 controls operation of the serving BTS 50 and the secondary BTS 52, while the BSC 48 controls operation of the secondary BTS 54.

Figure 5:
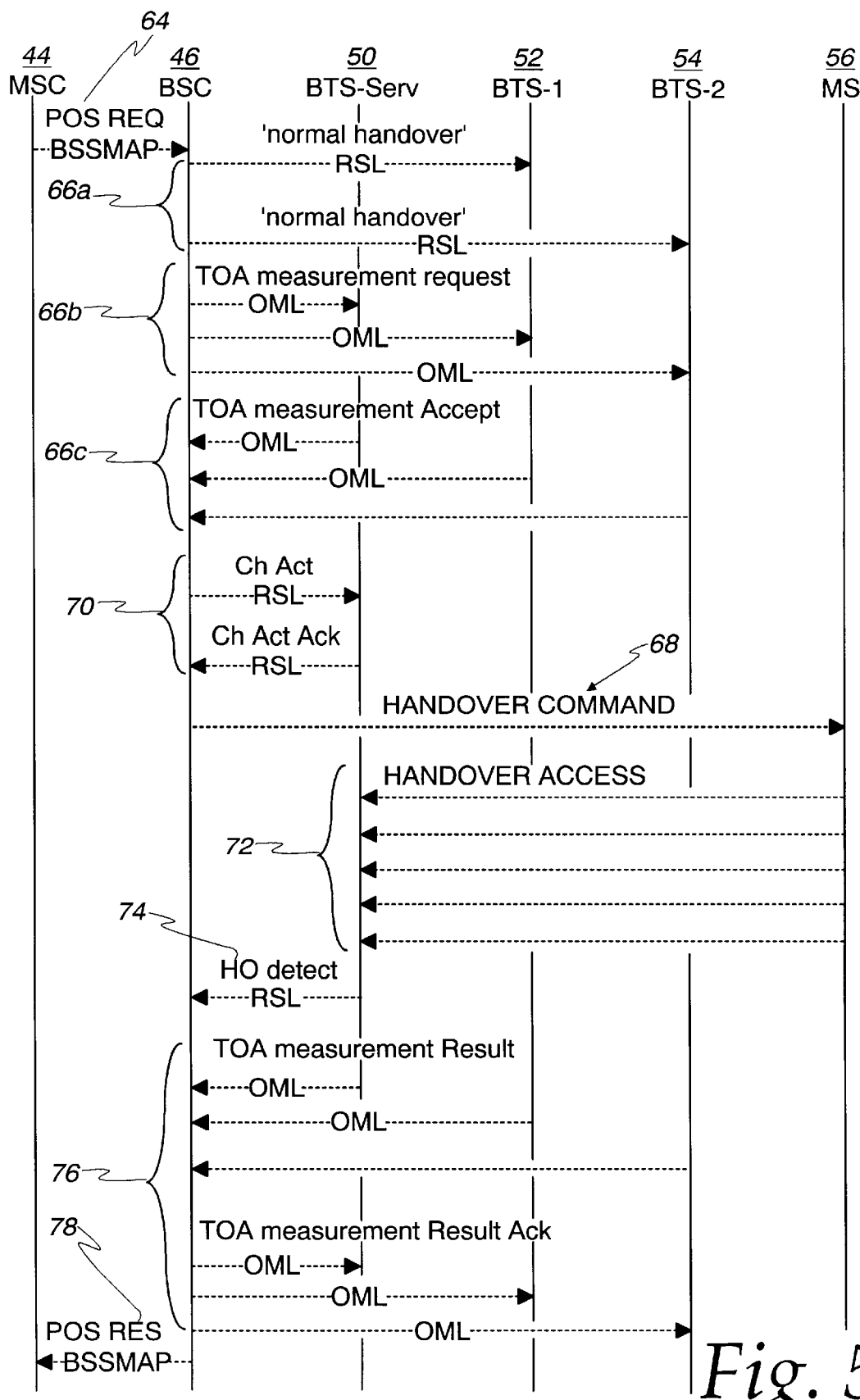
FIG. 5 is a flow chart illustrating positioning of a mobile subscriber in a mobile communication system.

Referring to FIG. 4, which illustrates the passing of specific signals between elements, and FIG. 5, which is a flow chart illustrating the steps for determining position of the mobile subscriber 56, operation will now be described. A request is made to the MPC 42 for the position of a mobile subscriber 56. The MPC 42 is the interface to external users, MS users, PLMN (Public Land Mobile Network) applications utilizing the positioning function, and to Public Safety Answering Points (PSAPs). The request may come from an application in the mobile subscriber 56, the PLMN 58, or a device or system external to the PLMN 58 (signal route 60). The MPC 42 sends the positioning request to the MSC 44 (signal 62). The MSC 44, after checking authority, determines if the MS 56 is in an idle or dedicated mode. If the MS 56 is in a dedicated mode, the MSC 44 forwards the positioning request to the serving BSC 46 (signal 64). If the MS 56 is in an idle mode, a call is set up by the MSC 44 before the positioning request is forwarded to the BSC 46. This call is not noticed by the MS 56; the ringing tone is not activated. Positioning an MS 56 which was initially idle will take longer than positioning an MS 56 which was already in a dedicated mode. The reason for this is that in order to utilize the location algorithm, the BSC 46 would have to wait for the MS 56 measurement reports.

The BSC 46, which may control a few hundred base stations, determines which base stations should listen to the MS 56 in order to determine position. Since the MS 56 is connected to the serving BTS 50, the BSC 46 already knows what cell the MS 56 is in because of such connection. Based on this information, the BSC 46 determines that certain base stations which surround the cell should measure the absolute time that a radio burst is received at that particular base station from the MS 56. Since the MS 56 transmits a TDM signal, such measuring can be performed.

The BSC 46 utilizes a handover candidate list, which is generally used for normal handovers (locating). This list is filtered so that only the top candidate for each site remains (several cells all belonging to the same site may make the handover candidate list). In case that less than two candidates remain in the handover candidate list, after filtering for the same site, a pre-stored positioning candidate list is used. This list is entered individually for each cell giving the preferred secondary cell ID's for positioning. This list is also filtered for candidates already in the filtered locating list. In the case where the serving BTS 50 does not support positioning, at least three secondary BTSs must be selected. It should be noted that various methods of optimally choosing base stations for location determination of the MS 56 are contemplated.

For simplicity, it is assumed that the serving BTS 50, along with the secondary BTSs 52, 54, will be used in positioning. Essentially, BSC 46 instructs the serving BTS 50 and secondary BTSs 52, 54 to listen in on the burst signal transmitted by the MS 56 (signal route 66). Since secondary BTS 54 is not under the control of BSC 46, the instructions sent to secondary BTS 54 must be transmitted via the MSC 44 and BSC 48, which services the secondary BTS 54.

The BSC 46 ensures that the specific radio channel, i.e., the specific time slot on a particular frequency, that the MS 56 is utilizing on the serving BTS 50 is also available in the secondary BTSs 52, 54 by clearing those radio channels (signals 66a). The BTS 50 preferably uses one of two different methods for clearing a radio channel, which will be discussed in detail later in this description. It should be noted, however, that more than one time slot may need to be cleared on a particular frequency if the system is not synchronized, i.e., the BTSs all have different time. If this is the case, the time slot the MS 56 is using on the serving base station 50 would not neatly correspond to a time slot in the secondary base stations 52, 54. Two, and maybe three, time slots in the secondary base stations 52, 54 may need to be cleared in order to properly perform the time of arrival measurements, since the burst signals may arrive in-between the two time slots. The BSC 46 essentially tells the BTSs 50, 52, 54 chosen for positioning that from a certain point of time in the future, i.e., a frame number, to start measuring the arrival time of burst signals from this particular MS 56 on a particular frequency.

The BSC 46 then sends a time of arrival measurement request to be BTSs 50, 52, 54 ordering them to start time of arrival measurements on the radio channel corresponding to the radio channel carrying the call in the serving BTS 50 (signals 66b). The BTSs 50, 52, 54 then send back a time of arrival measurement accept signal indicating that they are ready to perform time of arrival measurements (signals 66c). While FIG. 4 illustrates three BTSs used for positioning, in order to obtain an accuracy within 125 meters, at least five BTS's must be used for positioning.

In the case of a rural area where more sensitivity may be required, the MS 56 can be forced to perform an intra cell handover resulting in an access burst being transmitted (signal 68). In practical terms, this is an asynchronous intra cell handover, since a normal intra cell handover does not result in access bursts being transmitted. However, this means that two time slots will need to be available in the serving cell.

The decision whether access or normal bursts should be used is based on the result of the selection algorithm for the secondary BTSs. In the case where the locating algorithm provided two secondary BTSs, it is assumed that signal strength is good and normal bursts are used. In the case where the locating algorithm had to resort to pre-stored positioning candidates, access bursts are used, implying an asynchronous handover to the same cell.

An access burst provides more known bits (77 bits) than the training sequence of a normal burst (26 bits). This is estimated to give a 5 dB advantage, but results in an HO interrupt on the MS 56 to be positioned. Prior to transmitting the handover command (signal 68) to the MS 56, if necessary, the BSC 46 informs the BTSs 50, 52, 54 whether normal or access bursts will be utilized (signals 70), and in the case where an access burst is used, the BSC 46 informs the BTSs 50, 52, 54 of the training sequence (TSC) and handover reference number being used. While FIG. 5 only illustrates the BSC 46 informing the serving BTS 50 whether normal or access bursts will be utilized, the signals are also sent to the secondary BTSs 52, 54 which are to be utilized for positioning measurement.

The MS 56 transmits (access bursts in a rural area or normal bursts in a dedicated mode) and the BTSs 50, 52, 54 listen (signals 72). The BTSs 50, 52, 54 preferably measure the received burst signals before an equalizer but after an A/D converter (not shown). The BTSs 50, 52, 54 must listen until the burst signal is received. The BTSs 50, 52, 54 may have to wait whether a normal or an access burst is transmitted. Generally, time of arrival measurements should be completed in the order of 0.4–0.5 seconds. When enough information has been set, the serving BTS 50 sends a signal, at 74, to the BSC 46 indicating that measurement has been completed.

The BTSs 50, 52, 54 then send their respective time of arrival measurements to the BSC 46, which acknowledges receipt thereof (signals 76). The BSC 46 sends the time of arrival measurement values to the MPC 42 via the MSC 44 (signal 78). These time of arrival measurements are then conventionally analyzed by the MPC 42 to determine an approximate location of the MS 56.

Figure 6:
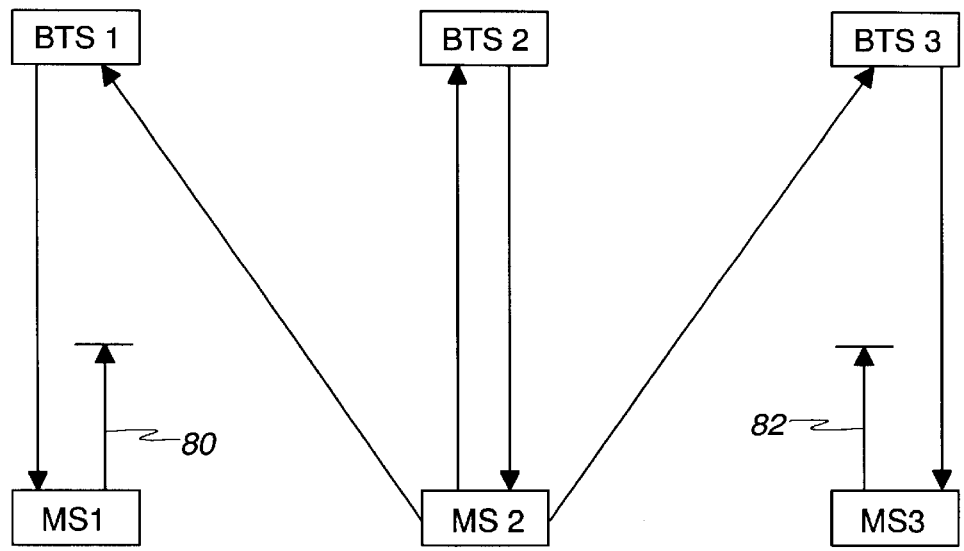
FIG. 6 is a block diagram illustrating clearing an appropriate channel on secondary base stations by means of interrupting uplink communication traffic.

Clearing an allocated time slot at the secondary base stations may be accomplished in one of two different ways. First, referring to FIG. 6, uplink traffic on the secondary base stations may be interrupted for a predetermined period of time, approximately 0.4–0.5 seconds, to measure the time of arrival of bursts. As shown in FIG. 6, assume there are three base stations (BTS1, BTS2, BTS3) each servicing a particular mobile subscriber, MS1, MS2, MS3, in a particular cell. It is determined that the position of MS2 is to be measured, and it is further determined that BTS1, BTS2 and BTS3 will be used to measure times of arrival of bursts. Mobile subscriber MS2, as previously described, sends out burst signals on a selected radio channel whose time of arrival is to be measured by the TRU's of BTS1, BTS2 and BTS3. Uplink traffic at BTS1 (signal 80) and BTS3 (signal 82) are interrupted during this measurement period. During this period, the traffic controller 34 is no longer receiving communication traffic from its respective mobile subscriber on the allocated time slot, and the measuring device 36 is activated to measure burst signal time of arrivals. After the predetermined period of time, switch 38 switches back to the traffic controller 34 and resumes uplink communication on the channel.

Figure 7:
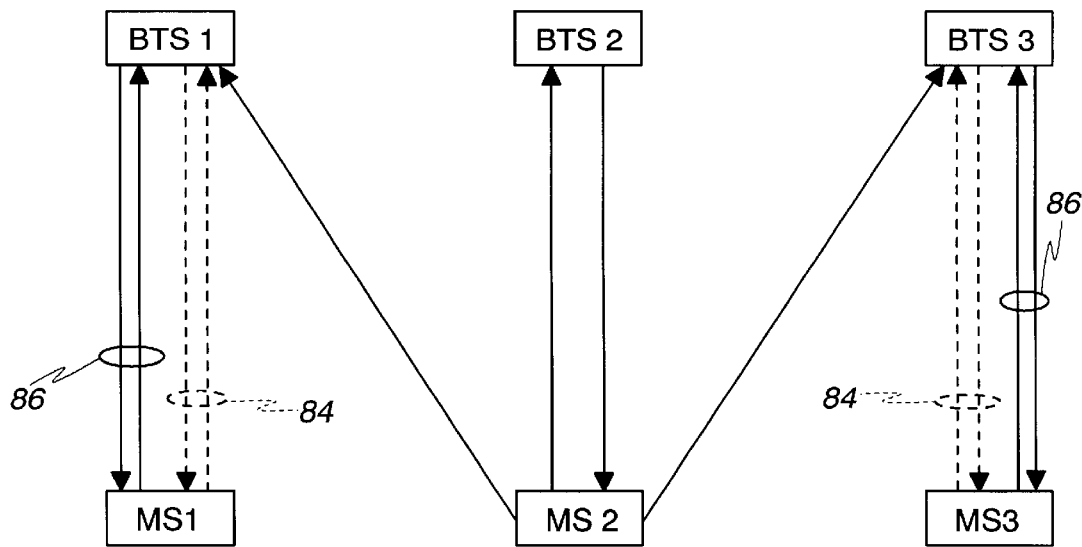
FIG. 7 is a block diagram illustrating clearing an appropriate channel on secondary base stations by means of handing over communication traffic to an alternate available channel.

Referring to FIG. 7, an alternative method of performing time of arrival measurements, is to move the call on the selected time slot of the secondary base station to another channel. This is done so that the time slot the BSC wants to use is empty. So now a mobile subscriber can communicate with the secondary base station on another channel without interruption.

As shown in FIG. 7, assume that mobile subscribers MS1 and MS3 are originally communicating with their respective base stations, BTS1 and BTS3, on a radio channel indicated by dotted lines 84. Assume further that this radio channel is desired to be used for positioning measurement for the mobile subscriber MS2. The BSC 46 will hand over communication traffic on that particular channel at mobile subscribers MS1 and MS3 to a different radio channel also available for communication traffic, shown at 86. Accordingly, communication at the mobile subscribers MS1 and MS3 is not interrupted for burst time of arrival measurements from mobile subscriber MS2.

It should be noted that the number of TRU's 14 in a particular base station equipped with the dual functionality is dependent upon how much positioning is preferred to be done. If six TRU's are used within a base station and only one is equipped with a traffic controller 34 and measuring device 36, preferably, the other five TRU's would be used first for traffic communication. The sixth TRU equipped with a dual functionality would be used for traffic also, but it would be used last. The sixth TRU would saved for positioning as long as it could.

Further, the TRU 14 equipped with the dual functionality may be implemented to perform the time of arrival measurement and time stamp signal properly. A control channel would then be used through the DXU 28, which is transparent to the DXU 28, to send the time of arrival information to the MPC 42 via the BSC 46 and MSC 44. Another implementation is to have the TRU work off the internal base station clock for time stamping. The TRU 14 then sends the time stamp signal to the DXU 28, which converts that internal time stamp to a local time stamp and forwards the time of arrival measurement to the MPC 42 via the BSC 46 and MSC 44.

While the invention has been described with particular reference to the drawings, it should be understood that various modifications could be made without departing from the spirit and scope of the present invention.

What is claimed is:

1. In a base station for use in a wireless communication system for communication with mobile subscribers over a plurality of radio channels, an improved transceiver unit comprising:

a traffic controller handling downlink and uplink communication traffic with mobile subscribers over the plurality of radio channels;

a measuring device measuring arrival times of burst signals on a select one of the plurality of radio channels from either a mobile subscriber communicating with the traffic controller on the select one of the radio channels, or from a mobile subscriber communicating on a transceiver unit of a different base station; and a switch operatively coupled to the traffic controller and the measuring device, the switch controlling the traffic controller and measuring device so that only one of the traffic controller and measuring device is operated at one time on the select one of the plurality of radio channels.

2. The improved transceiver unit of claim 1, wherein uplink communication traffic on said select one of the plurality of radio channels at the traffic controller is interrupted during burst signal measurement by the measuring device.

3. The improved transceiver unit of claim 2, wherein uplink communication traffic on said select one of the plurality of radio channels at the traffic controller is interrupted for approximately 0.4–0.5 seconds for burst signal time of arrival measurement.

4. The improved transceiver unit of claim 1, wherein downlink and uplink communication traffic on said select one of the plurality of radio channels is cleared at the traffic controller to allow the measuring device to measure burst signal time of arrival on said one of the plurality of radio channels.

5. The improved transceiver unit of claim 4, wherein downlink and uplink communication traffic on said select one of the plurality of radio channels is switched to another of the plurality of radio channels available for communication traffic at the traffic controller to allow the measuring device to measure burst signal time of arrival on said one of the plurality of radio channels.

\* \* \* \* \*